(12) United States Patent
Schmidt et al.

(10) Patent No.: US 7,985,477 B2
(45) Date of Patent: Jul. 26, 2011

(54) LIQUID-REPELLENT, ALKALI-RESISTANT COATING COMPOSITION AND COATING SUITABLE FOR PATTERN FORMING

(75) Inventors: Helmut Schmidt, Saarbruecken-Guedingen (DE); Carsten Becker-Willinger, Saarbruecken (DE); Pamela Kalmes, Merchweiler (DE); Etsuko Hino, Tokyo (JP); Norio Ohkuma, Tokyo (JP)

(73) Assignees: Leibniz- Institut Fuer Neue Materialien Gemeinnuetzige GmbH, Saarbruecken (DE); Canon Kabushiki Kaisha, Tokyo (JP)

( * ) Notice: Subject to any disclaimer, the term of this patent is extended or adjusted under 35 U.S.C. 154(b) by 765 days.

(21) Appl. No.: 11/297,200

(22) Filed: Dec. 8, 2005

(65) Prior Publication Data

US 2006/0154091 A1    Jul. 13, 2006

Related U.S. Application Data

(63) Continuation of application No. PCT/EP03/007998, filed on Jul. 22, 2003.

(51) Int. Cl.
*B32B 27/38* (2006.01)
*B05D 1/00* (2006.01)
*B05D 1/32* (2006.01)
*B05D 3/06* (2006.01)
*C08L 63/00* (2006.01)
*C08L 83/04* (2006.01)

(52) U.S. Cl. ........ 428/413; 428/417; 428/418; 428/447; 428/450; 427/282; 427/287; 427/386; 427/387; 427/428.01; 427/510; 427/515; 427/516; 427/517; 525/474; 525/476; 525/523; 525/524; 525/525

(58) Field of Classification Search .................. 525/474, 525/476, 523, 524, 525; 427/508, 510, 512, 427/515, 516, 517, 282, 287, 386, 387, 428.01; 428/413, 417, 418, 447, 450
See application file for complete search history.

(56) References Cited

U.S. PATENT DOCUMENTS

| | | | |
|---|---|---|---|
| 5,057,550 A * | 10/1991 | Lutz et al. ..................... | 522/148 |
| 5,178,959 A * | 1/1993 | Eckberg et al. ................. | 522/31 |
| 5,217,805 A | 6/1993 | Kessel et al. | |
| 5,260,348 A | 11/1993 | Shepherd et al. | |
| 5,411,996 A * | 5/1995 | Eckberg et al. ................. | 522/31 |
| 5,644,014 A | 7/1997 | Schmidt et al. | |
| 5,656,336 A | 8/1997 | Kamen et al. | |
| 5,674,964 A | 10/1997 | Wolter et al. | |
| 5,721,015 A | 2/1998 | Iwamura et al. | |
| 5,910,522 A | 6/1999 | Schmidt et al. | |
| 5,973,176 A * | 10/1999 | Roscher et al. ................. | 556/440 |
| 6,121,339 A * | 9/2000 | Kominami et al. .............. | 522/31 |
| 6,358,612 B1 | 3/2002 | Bier et al. | |
| 6,423,378 B1 | 7/2002 | Cotting et al. | |
| 6,455,112 B1 * | 9/2002 | Ohkuma et al. ................ | 427/504 |
| 6,476,174 B1 | 11/2002 | Lee et al. | |
| 6,511,753 B1 | 1/2003 | Teranishi et al. | |
| 6,632,897 B1 | 10/2003 | Geiter et al. | |
| 6,743,510 B2 | 6/2004 | Ochiai | |
| 6,911,235 B2 | 6/2005 | Frances et al. | |
| 2002/0001016 A1 | 1/2002 | Aono et al. | |
| 2003/0169313 A1 | 9/2003 | Shimomura et al. | |
| 2003/0211338 A1 | 11/2003 | Frances et al. | |
| 2003/0224286 A1 | 12/2003 | Barclay et al. | |
| 2006/0132539 A1 | 6/2006 | Hino et al. | |
| 2006/0153993 A1 * | 7/2006 | Schmidt et al. ................ | 427/470 |
| 2008/0213547 A1 | 9/2008 | Becker-Willinger et al. | |

FOREIGN PATENT DOCUMENTS

| | | |
|---|---|---|
| CN | 1218437 | 6/1999 |
| CN | 1416447 | 5/2003 |
| CN | 1432601 A | 7/2003 |
| DE | 10323729 A1 | 12/2004 |
| DE | 102005002960 A1 | 8/2006 |
| EP | 0431809 A2 | 6/1991 |
| EP | 0 466 025 A | 1/1992 |
| EP | 0 567 969 A | 11/1993 |
| EP | 0965618 A1 | 12/1999 |
| EP | 1045290 A2 | 10/2000 |
| EP | 1 120 448 B | 8/2001 |
| EP | 1 215 254 A | 6/2002 |
| JP | 63048363 A | 3/1988 |
| JP | 03293067 A | 12/1991 |
| JP | 5262961 A | 10/1993 |
| JP | 08266994 A | 10/1996 |
| JP | 2000212443 A | 8/2000 |
| JP | 2000347001 A | 12/2000 |
| JP | 2004155454 | 6/2004 |
| JP | 2004155954 A1 | 6/2004 |
| JP | 2005004052 | 1/2005 |
| JP | 2005015581 A | 1/2005 |
| JP | 2005089697 A | 4/2005 |
| KR | 20030040065 | 5/2003 |
| TW | 482817 B | 4/2002 |
| WO | WO/97/32732 | 12/1997 |
| WO | WO 98/51747 A1 | 11/1998 |
| WO | WO 99/63022 A1 | 12/1999 |
| WO | WO0153385 A1 | 7/2001 |
| WO | WO 2005/014742 A1 | 2/2005 |

(Continued)

OTHER PUBLICATIONS

Product Data Sheet for EHPE 3150, provided by Daicel Chemical Industries, LTD. (no date).*

(Continued)

*Primary Examiner* — Michael J Feely
(74) *Attorney, Agent, or Firm* — Cahn & Samuels, LLP

(57) ABSTRACT

A cationically polymerizable composite coating composition comprising: a) a condensation product of at least one hydrolyzable silane having a fluorine-containing group, b) at least one cationically polymerizable organic resin, and c) a cationic initiator, provides, upon curing, substrates with an alkali-resistant, liquid-repellent coating. The composite coating composition may be used in pattern forming methods.

23 Claims, 1 Drawing Sheet

FOREIGN PATENT DOCUMENTS

| | | |
|---|---|---|
| WO | WO 2005/014745 | 2/2005 |
| WO | WO 2006/077140 A1 | 7/2006 |
| WO | WO 2008/009608 | 1/2008 |

OTHER PUBLICATIONS

Machine translation of JP 2000-212443 A, provided by the JPO website (no date).*
English abstract of CN 1218437.
English abstract of CN 1416447.
English abstract of KR 20030040065.
English Abstract of JP 5262961.
Abstract of Jiguet, S., et al., "Conductive SU8-silver Composite Photopolymer," IEEE International Conference on Micro Electro Mechancial Systems, Technical Digest, 17th, Jan. 25-29, 2004, pp. 125-128.
Abstract of JP 2004 155954 A.
English Abstract of DE102005002960 (Aug. 3, 2006).
English Abstract of DE10323729 (Dec. 16, 2004).
English Abstract of JP2005015581 (Jan. 20, 2005).
English Abstract of JP2005089697 (Apr. 7, 2005).
English Abstract of JP2000347001 (Dec. 15, 2000).
English Abstract of WO 1998/51747 (Nov. 19, 1998).
English Abstract of JP2004155954 (Jun. 3, 2004).
English Abstract of JP 2000212443.
Japanese Intellectual Property Office, Office Action for Japanese patent application No. 2005-507495 issued Nov. 18, 2009.
English translation of Japanese Intellectual Property Office, Office Action for Japanese patent application No. 2005-507495 issued Nov. 18, 2009 (citing Japanese Patent Publication No. 2000-212443).
Japanese Intellectual Property Office, Office Action for Japanese patent application No. 2005-507496 issued Nov. 18, 2009.
English translation of Japanese Intellectual Property Office, Office Action for Japanese patent application No. 2005-507496 issued Nov. 18, 2009 (citing Japanese Patent Publication No. 2000-212443).
Office Action for Japanese Patent Application No. 2005-507496, Mailed on Jul. 28, 2010.
Office Action for Japanese Patent Application No. 093121967.
English Abstract of JP 63048363.
English Abstract of WO 99/63022.
English Abstract of JP 08266994.
Machine translation of JP 08266994.
English Abstract of JP 03293067.
English Abstract of on CN 1432601.
English Abstract of TW 482817.
Office Action of Japanese Patent Application No. 2005-507495 dated Jul. 28, 2010.

* cited by examiner

LIQUID-REPELLENT, ALKALI-RESISTANT COATING COMPOSITION AND COATING SUITABLE FOR PATTERN FORMING

RELATED APPLICATIONS

This application is a continuation application of International Application No. PCT/EP2003/007998 filed Jul. 22, 2003, for "Liquid-Repellent, Alkali-Resistant Coating Composition and Coating Suitable For Pattern Forming", in the names of Helmut SCHMIDT, Carsten BECKER-WILLINGER, Pamela KALMES, Etsuko HINO, and Norio OHKUMA, published as International Patent Publication No. WO 2005/014745 A1, published Feb. 17, 2005, the disclosures of which are herein incorporated by reference in their entireties.

FIELD OF THE INVENTION

The present invention relates to a coating system based on a cationically polymerizable composite system comprising organic/inorganic polycondensates containing fluorine-containing groups and an organic resin, to substrates coated with said coating composition, and to a method of preparing a substrate having such a coating, in particular, a pattern forming method.

BACKGROUND OF THE INVENTION

Coating materials with low surface free energy are of great interest for many reasons. The low surface free energy provides liquid-repellent properties as well as anti-adhesion properties. For this reason, various systems have been developed, e.g. systems including PTFE as a low surface free energy polymer due to the presence of perfluorinated carbon chains or acrylic systems including perfluorinated carbon chain containing polymers. Sol-gel based systems have been developed on the basis of hydrolyzable silanes having perfluorinated side chains, and gradient coatings have been fabricated from these fluorosilanes. These materials are generally cured or hardened by thermal treatment resulting in the formation of Si—O—Si bonds. However, these systems based on an inorganic matrix are very sensitive to alkaline attack due to the low stability of the Si—O—Si bond at higher pH values.

When acrylic bonds capable of crosslinking are included, photocurable systems are obtained. However, the crosslinking degree upon formation of inorganic Si—O—Si bonds (inorganic condensation) is rather poor when the coatings are photocured so that the sensitivity to alkaline attack is still high. The addition of other organic polymeric compounds does not change this situation. This is because stable, highly condensed matrices containing Si—O—Si bonds require hardening at high temperatures which are generally not applicable to such polymers, as described in C. J. Brinker, G. W. Scherer: "Sol-Gel Science—The Physics and Chemistry of Sol-Gel-Processing", Academic Press, Boston, San Diego, New York, Sydney (1990).

Photolithographic processes involving the systems described above also suffer from a poor alkali resistance. However, a high alkali resistance for low surface free energy coating is critical in order to be able to clean the surfaces with appropriate alkaline cleaners or to maintain a liquid-repellent surface even when contacting fluids of a higher pH. This problem is still unsolved for low surface free energy materials currently in use. Furthermore, liquid repellency coatings also having a high resolution and/or high aspect ratio pattern are not known.

Accordingly, it is an object of the present invention to provide a substrate having a liquid-repellent coating of high alkali resistance which can be used in pattern forming methods.

These and other objects are achieved in accordance with the invention by means of a cationically polymerizable composite coating composition comprising: a) a condensation product of at least one hydrolyzable silane having a fluorine-containing group, b) at least one cationically polymerizable organic resin, and c) a cationic initiator.

SUMMARY OF THE INVENTION

The present invention provides a coating composition for producing an unexpectedly superior alkali-resistant, liquid-repellent layer on a substrate, such as metal, glass, ceramic, or polymer substrates, which may be optionally pre-treated or pre-coated. The coating compositions provide photosensitive characteristics for pattern forming by photolithography. The coating composition may include: a) a condensation product of at least one hydrolyzable silane having a fluorine-containing group, b) at least one cationically polymerizable organic resin, and c) a cationic initiator. The coating composition may be applied to a substrate, optionally dried, and then cured or hardened by exposure to light or radiation, or heat, or a combination thereof.

DETAILED DESCRIPTION OF THE INVENTION

Figure 1:
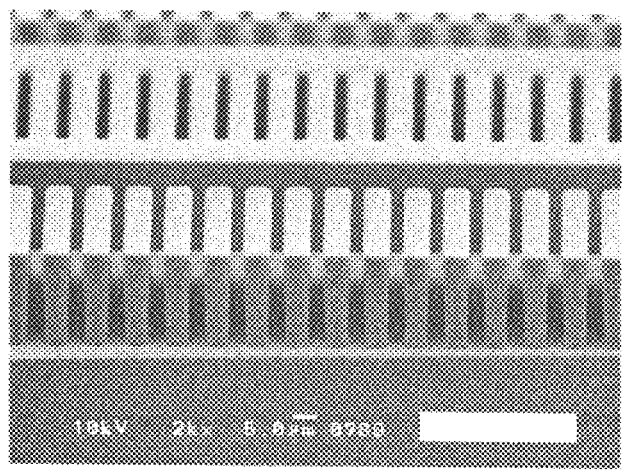
FIG. 1 shows a high resolution and high aspect ratio first pattern obtainable with a coating composition of the present invention.

Use of the composite coating composition according to the present invention results in a coating having outstanding properties. In particular, it was completely unexpected that coatings obtained with this coating composition were found to have an extremely high alkali resistance as evidenced by the fact that in highly alkaline solutions with a pH above 10, the coatings were stable for several months at 60° C. Furthermore, the liquid-repellent properties are maintained at nearly the same level as evidenced by measurement of the contact angles. Such chemical resistance is not achieved by the hybrid material coatings according to the prior art. Moreover, even though the coating compositions of the present invention have a relatively high silicate content, they also provide photosensitive characteristics for pattern forming by photolithography.

Without wishing to be bound to any theory, the surprising improvements of the present invention are believed to result at least partially from the combination of the inorganic silicate backbone and the organic polymeric backbone formed at the same time through a cationic polycondensation process and the cationically polymerizable resin by means of the cationic initiator. The cationically polymerizable groups of the resin may be polymerized by a cationic polymerisation process, which at the same time may also enhance the condensation degree within the inorganic silicate network.

The low surface free energy of the coatings prepared from the coating compositions caused by the fluorinated silanes results in excellent liquid-repellent properties. Apparently, a very specific structure is formed according to the invention which likely includes a new type of interpenetrating network (IPN), with the condensation process of the fluorinated silanes as well as the cationic polymerisation process of the organic resin being enhanced by the cationic initiator and resulting in a surprising stability of the coating not known from other systems. It is highly preferred that fluorinated silanes are added to said organic resin in the form of the condensation product. If the fluorinated silanes are added to said organic resin in form of the monomers, the fluorinated silanes do not mix with the organic resin and a phase separated structure is formed. Generally, the phase separation structure does not have photo-patterning ability.

The cured coating composition comprises an organically modified siloxane framework (inorganic framework) formed from the hydrolyzable silanes and an organic framework formed by the cationically polymerized resin which is linked by ether bonds, if epoxy groups are used. In this manner, the cured coating composition represents a hybrid material wherein organic and inorganic components are combined.

An important feature of the present invention is the presence of a cationic initiator, i.e. the fact that the formation and curing of the coating compositions involves cationic polymerization and/or polycondensation reactions. Without wishing to be bound to any theory, the surprisingly improved chemical resistance, especially the alkali resistance, as compared to systems involving radical polymerisation reactions is believed to be the result of cationic polymerisation reactions which lead to linkages, typically ether linkages in the case of epoxy groups, apparently resulting in a more stable network so that the coatings obtained will be hardly hydrolyzed in highly alkaline solutions.

In the following, the present invention will be described in more detail.

The coating composition of the invention comprises a condensation product of at least one hydrolyzable silane having a fluorine-containing group. Hydrolyzable silanes comprise at least one hydrolyzable substituent.

The at least one hydrolyzable silane having a fluorine-containing group is a silane having hydrolyzable substituents and at least one non-hydrolyzable substituent carrying at least one fluorine atom which is generally bound to a carbon atom. For simplification, these silanes are sometimes referred to below as fluorosilanes. Specific examples of fluorosilanes which can be used in accordance with the invention can be taken from WO 92/21729, hereby incorporated by reference in its entirety.

Said fluorosilane preferably comprises only one non-hydrolyzable substituent having a fluorine-containing group, but may also contain a further non-hydrolyzable substituent having no fluorine atoms. The at least one non-hydrolyzable substituent containing a fluorine-containing group of the fluorosilane contains generally at least 1, preferably at least 3 and in particular at least 5 fluorine atoms, and generally not more than 30, more preferably not more than 25 and especially not more than 21 fluorine atoms which are attached to one or more carbon atoms. It is preferred that said carbon atoms are aliphatic including cycloaliphatic atoms. Further, the carbon atoms to which fluorine atoms are attached are preferably separated by at least two atoms from the silicon atom which are preferably carbon and/or oxygen atoms, e.g. a $C_{1-4}$ alkylene or a $C_{1-4}$ alkylenoxy, such as an ethylene or ethylenoxy linkage.

Preferred hydrolyzable silanes having a fluorine-containing group are those of general formula (I):

$$RfSi(R)_b X_{(3-b)} \tag{1}$$

wherein Rf is a non-hydrolyzable substituent having 1 to 30 fluorine atoms bonded to carbon atoms, R is a non-hydrolyzable substituent, X is a hydrolyzable substituent, and b is an integer from 0 to 2, preferably 0 or 1 and in particular 0.

In general formula (I) the hydrolyzable substituents X, which may be identical or different from one another, are, for example, hydrogen or halogen (F, Cl, Br or I), alkoxy (preferably $C_{1-6}$ alkoxy, such as methoxy, ethoxy, n-propoxy, isopropoxy and n-butoxy, sec-butoxy, isobutoxy, and tert-butoxy), aryloxy (preferably $C_{6-10}$ aryloxy, such as phenoxy), acyloxy (preferably $C_{1-6}$ acyloxy, such as acetoxy or propionyloxy), alkylcarbonyl (preferably $C_{2-7}$ alkycarbonyl, such as acetyl), amino, monoalkylamino or dialkylamino having preferably from 1 to 12, in particular from 1 to 6, carbon atoms. Preferred hydrolyzable radicals are halogen, alkoxy groups, and acyloxy groups. Particularly preferred hydrolyzable radicals are $C_{1-4}$ alkoxy groups, especially methoxy and ethoxy.

The non-hydrolyzable substituent R, which may be identical to or different from one another, may be a non-hydrolyzable radical R containing a functional group or may be a non-hydrolyzable radical R without a functional group. In general formula (I) the substituent R, if present, is preferably a radical without a functional group.

The non-hydrolyzable radical R without a functional group is, for example, alkyl (e.g., $C_{1-8}$ alkyl, preferably $C_{1-6}$ alkyl, such as methyl, ethyl, n-propyl, isopropyl, n-butyl, s-butyl and t-butyl, pentyl, hexyl, and octyl), cycloalkyl (e.g. $C_{3-8}$ cycloalkyl, such as cyclopropyl, cyclopentyl or cyclohexyl), alkenyl (e.g. $C_{2-6}$ alkenyl, such as vinyl, 1-propenyl, 2-propenyl and butenyl), alkynyl (e.g. $C_{2-6}$ alkynyl, such as acetylenyl and propargyl), cycloalkenyl and cycloalkynyl (e.g. $C_{2-6}$ alkenyl and cycloalkynyl), aryl (e.g. $C_{6-10}$ aryl, such as phenyl and naphthyl), and corresponding arylalkyl and alkylaryl (e.g. $C_{7-15}$ arylalkyl and alkylaryl, such as benzyl or tolyl). The radicals R may contain one or more substituents, such as halogen, alkyl, aryl, and alkoxy. In formula (I) R when present is preferably methyl or ethyl.

As mentioned above, the non-hydrolyzable substituent R of formula (I) may contain also one or more functional groups. Examples of such groups can be found in the definition of substituent Rc having functional groups in formula (III) below.

The non-hydrolyzable substituent Rf comprises at least 1, preferably at least 3 and in particular at least 5 fluorine atoms, and generally not more than 30, more preferably not more than 25 and especially not more than 21 fluorine atoms which are attached to one or more carbon atoms. It is preferred that said carbon atoms are aliphatic including cycloaliphatic atoms. Further the carbon atoms to which fluorine atoms are attached are preferably separated by at least one, preferably at least two atoms from the silicon which are preferably carbon and/or oxygen atoms, e.g. an $C_{1-4}$ alkylene or an $C_{1-4}$ alkylenoxy, such as an ethylene or ethylenoxy linkage.

The substituent Rf has preferably less than 20 carbon atoms and it is preferred that it has at least 3 carbon atoms where a preferred range includes from 3 to 15 carbon atoms. The carbon atoms to which the fluorine atoms are attached are preferably aliphatic carbon atoms which includes cycloaliphatic carbon atoms. Rf comprises preferably a fluorinated or perfluorinated alkyl group linked via an alkylene or alkylenoxy unit to the silicon atom. A particular preferred substituent Rf is $CF_3(CF_2)_n—Z$ where n and Z are defined as defined in formula (IV) below. Specific examples of Rf are $CF_3CH_2CH_2$, $C_2F_5CH_2CH_2$, $C_4H_9C_2H_4$, $n-C_6F_{13}CH_2CH_2$, $i-C_3F_7OCH_2CH_2CH_2$, $n-C_8F_{17}CH_2CH_2$, $i-C_3F_7O(CH_2)_3$ and $n-C_{10}F_{21}CH_2CH_2$. Particularly preferred are $n-C_6F_{13}CH_2CH_2$, $n-C_8F_{17}CH_2CH_2$, and $n-C_{10}F_{21}CH_2CH_2$.

A particular preferred silane is a compound of general formula (IV)

$$CF_3(CF_2)_n—Z—SiX_3 \quad (IV)$$

wherein X is as defined in general formula (I) and preferably is methoxy or ethoxy, Z is a divalent organic group, and n is an integer from 0 to 20, preferably 3 to 15, more preferably 5 to 10. Preferably, Z contains not more than 10 carbon atoms and Z is more preferably a divalent alkylene or alkyleneoxy group having not more than 6, in particular not more than 4 carbon atoms, such as methylene, ethylene, propylene, butylene, methylenoxy, ethyleneoxy, propylenoxy, and butylenoxy. Most preferred is ethylene.

Specific examples are $CF_3CH_2CH_2SiCl_2(CH_3)$, $CF_3CH_2CH_2SiCl(CH_3)_2$, $CF_3CH_2CH_2Si(CH_3)(OCH_3)_2$, $CF_3CH_2CH_2SiX_3$, $C_2F_5CH_2CH_2SiX_3$, $C_4F_9CH_2CH_2SiX_3$, $n-C_6F_{13}CH_2CH_2SiX_3$, $n-C_8F_{17}CH_2CH_2SiX_3$, $n-C_{10}F_{21}CH_2CH_2SiX_3$ ($X=OCH_3$, $OC_2H_5$ or Cl); $i-C_3F_7O—CH_2CH_2CH_2—SiCl_2(CH_3)$, $n-C_6F_{13}—CH_2CH_2—SiCl(OCH_2CH_3)_2$, $n-C_6F_{13}—CH_2CH_2—SiCl_2(CH_3)$ and $n-C_6F_{13}—CH_2CH_2—SiCl(CH_3)_2$. Particularly preferred are $CF_3—C_2H_4—SiX_3$, $C_2F_5—C_2H_4—SiX_3$, $C_4F_9—C_2H_4—SiX_3$, $C_6F_{13}—C_2H_4—SiX_3$, $C_8F_{17}—C_2H_4—SiX_3$, and $C_{10}F_{21}—C_2H_4—SiX_3$, where X is a methoxy or ethoxy group.

Furthermore, the inventors have found that by using at least two different hydrolyzable silanes having a fluorine-containing group of a different kind unexpectedly improved results are obtained, especially with regard to liquid-repellent properties, and resistance to chemicals such as developing solutions or alkaline solutions. The silanes used preferably differ in the number of fluorine atoms contained therein or in the length (number of carbon atoms in the chain) of the fluorine-containing substituent.

Although the reason for these improvements is not clear, the fluoroalkyl groups of different length are believed to cause a structural arrangement of higher density, since the fluoroalkyl group should take an optimal arrangement in the uppermost surface. For example, in the case where at least two of $C_6F_{13}—C_2H_4SiX_3$, $C_8F_{17}—C_2H_4—SiX_3$, and $C_{10}F_{21}—C_2H_4—SiX_3$ (X as defined above) are used together, the high fluoride concentration in the uppermost surface is represented by fluoroalkyl groups of different length which results in the named improvements compared to the addition of a single fluorosilane.

According to one preferred embodiment of the present invention a further hydrolyzable silane not containing any fluorine atoms may be used for preparing the condensation product, which silane may be selected from one or more silanes having at least one alkyl substituent, a silane having at least one aryl substituent and a silane having no non-hydrolyzable substituent. The hydrolyzable or non-hydrolyzable substituents of the silanes may be unsubstituted or substituted. Examples of suitable substituents are conventional substituents such as halogen or alkoxy. Said silanes having alkyl substituents, aryl substituents or having no non-hydrolyzable substituent can be used for controlling the physical properties of the liquid-repellent layer.

Preferred further hydrolyzable silanes which may be used in the present invention are those of general formula (II):

$$R_aSiX_{(4-a)} \quad (II)$$

wherein R is a non-hydrolyzable substituent, X is a hydrolyzable substituent, and a is an integer from 0 to 3. In the case where a is 0, the silane contains only hydrolyzable groups. The substituents R and X have the same meanings as defined in formula (I). It is preferred that R is independently selected from optionally substituted alkyl and optionally substituted aryl or that a=0. R is preferably alkyl, preferably $C_{1-6}$ alkyl, or aryl, preferably phenyl, and X is preferably $C_{1-4}$ alkoxy, preferably methoxy or ethoxy.

Specific, non-limiting examples of said further hydrolyzable silanes are tetramethoxysilane, tetraethoxysilane, tetrapropoxysilane, methyltrimethoxysilane, methyltriethoxysilane, methyltripropoxysilane, ethyltrimethoxysilane, ethyltriethoxysilane, ethyltripropoxysilane, propyltrimethoxysilane, propyltriethoxysilane, propyltripropoxysilane, phenyltrimethoxysilane, phenyltriethoxy-silane, phenyltripropoxysilane, dimethyldiethoxysilane, dimethyldimethoxysilane, diphenyldimethoxysilane, and diphenyldiethoxysilane.

Another further hydrolyzable silane not containing any fluorine atoms which may be used for preparing the condensation product, can be selected from a silane having a polymerizable group. This may be a functional group, which is relatively reactive and may undergo a reaction in the course of the preparation of the coatings, though it may also remain unreacted. Said functional group may be capable of undergoing a polymerizing or crosslinking reaction, either alone or in combination with another functional group. The polymerizable group is preferably a photopolymerizable group, especially an epoxy group.

Said further hydrolyzable silane comprises at least one non-hydrolyzable substituent comprising at least one polymerizable group. Polymerizable groups which can be polymerized or crosslinked are known to the person skilled in the art. This group is preferably a cationically polymerizable group; further it is preferred that said group is a photopolymerizable group. Such hydrolyzable silanes may have the structure of general formula (II) where at least one substituent R is a substituent Rc containing at least one polymerizable group. Examples of substituents Rc are defined below in formula (III). Preferably, the silane contains only one substituent having polymerizable group(s).

Specific examples of cationically polymerizable groups are cyclic ether groups (preferably epoxy groups including glycidyl and glycidoxy), cyclic thioether groups, spiroorthoester groups, cyclic amide groups (lactam), cyclic ester groups (lactone), cyclic imine, 1,3-dioxacycloalkane (ketale) and vinyl groups to which an electron donating group, e.g. alkyl, alkenyl, alkoxy, aryl, CN, or COOAlkyl, is attached, e.g. a vinyl ether group, an isobutenyl group, or a vinyl phenyl group. Preferred cationically polymerizable groups are epoxy and vinyl ether groups, the epoxy group being particularly preferred, especially in view of its availability and ease of reaction control.

Accordingly, a preferred hydrolyzable silane having a polymerizable group is a compound of general formula (III):

$$RcSi(R)_bX_{(3-b)} \quad (III)$$

wherein Rc is a non-hydrolyzable substituent having a polymerizable group, R is a non-hydrolyzable substituent, X is a hydrolyzable substituent, and b is an integer from 0 to 2, preferably 0.

The polymerizable group Rc is preferably a cationically polymerizable group, such as those mentioned above. Specific examples of the cationically polymerizable group of the non-hydrolyzable substituent Rc by way of which polymerizing or crosslinking is possible are epoxide groups, including glycidyl and glycidoxy groups, and vinyl ether groups. These functional groups are attached to the silicon atom by way of a divalent organic group, such as alkylene, including cycloalkylene, alkenylene or arylene bridge groups, which may be interrupted by oxygen or —NH— groups. Examples for said bridge groups are further the divalent equivalents of all the groups, which have been defined for the non-hydrolyzable radical R of general formula (I), which may be interrupted by oxygen or —NH— groups. Of course, the bridge may also contain one or more conventional substituents such as halogen or alkoxy. The bridge is preferably a $C_{1-20}$ alkylene, more preferably a $C_{1-6}$ alkylene, which may be substituted, for example, methylene, ethylene, propylene or butylene, especially propylene, or cyclohexylalkyl, especially cyclohexylethyl.

Specific examples of said substituent Rc are glycidyl or glycidyloxy $C_{1-20}$ alkyl, such as γ-glycidylpropyl, β-glycidoxyethyl, γ-glycidoxypropyl, δ-glycidoxybutyl, ε-glycidoxypentyl, ω-glycidoxyhexyl, and 2-(3,4-epoxycyclohexyl) ethyl. The most preferred substituents Rc are glycidoxypropyl and epoxycyclohexylethyl.

Specific examples of corresponding silanes are γ-glycidoxypropyltrimethoxysilane (GPTS), γ-glycidoxypropyltriethoxysilane (GPTES), epoxycyclohexylethyltrimethoxysilane, and epoxycyclohexylethyltriethoxysilane. However, the invention is not limited to the above-mentioned compounds.

Further examples of polymerizable group of the non-hydrolyzable substituent Rc by way of which polymerizing or crosslinking is possible are isocyanato, hydroxyl, ether, amino, monoalkylamino, dialkylamino, optionally substituted anilino, amide, carboxyl, vinyl, allyl, acryloyl, acryloyloxy, methacryloyl, methacryloyloxy, mercapto, and cyano. These functional groups are also attached to the silicon atom by way of a divalent organic group, such as alkylene, including cycloalkylene, alkenylene or arylene bridge groups, which may be interrupted by oxygen or —NH— groups. Examples for said bridge groups are the divalent equivalents of all the groups, which have been defined for the non-hydrolyzable radical R of general formula (I), which may be interrupted by oxygen or —NH— groups. Of course, the bridge may also contain one or more conventional substituents such as halogen or alkoxy.

Specific examples of said other polymerizable group Rc are a (meth)acryloyloxy-$(C_{1-6})$-alkylene radical, where $(C_{1-6})$-alkylene stands, for example, for methylene, ethylene, propylene or butylene, and a 3-isocyanatopropyl radical. Specific examples of corresponding silanes are 3-isocyanatopropyltriethoxysilane, 3-isocyanatopropyldimethylchlorosilane, 3-aminopropyltrimethoxysilane (APTS), 3-aminopropyltriethoxysilane, N-(2-aminoethyl)-3-aminopropyltrimethoxysilane, N-[N'-(2'-aminoethyl)-2-aminoethyl]-3-aminopropyltrimethoxysilane, hydroxymethyltriethoxysilane, bis(hydroxyethyl)-3-aminopropyltriethoxysilane, N-hydroxy-ethyl-N-methylaminopropyltriethoxysilane, 3-(meth)acryloyloxypropyltriethoxysilane and 3-(meth)acryloyloxypropyltrimethoxysilane.

According to one further preferred embodiment of the present invention at least two further hydrolyzable silanes not containing any fluorine atoms are used for preparing the condensation product, one of which does not contain a polymerizable group, such as the silane of formula (II), and one of which contains a polymerizable group, especially a cationically polymerizable group, such as the silane of formula (III). The polymerizable group is preferably a photopolymerizable group.

The proportion of the silanes used for preparing the condensation product is selected according to the application desired and is within the knowledge of a person skilled in the art of manufacture of organically modified inorganic polycondensates. It has been found that the hydrolyzable silanes having a fluorine-containing group are appropriately used in amounts in the range from 0.5 to 20% by mole, preferably 1 to 10% by mole, based on the total amount of hydrolyzable compounds used. Within these ranges a high liquid repellency as well as a very uniform surface are obtained. The latter is especially important for optical applications involving irradiation since the surface obtained often tends to have concave and/or convex forms which affect light scattering. Thus, the above-mentioned ranges provide highly repellent, even surfaces which are especially suited for photocuring and/or recording applications.

For the preparation of the condensation product, also other hydrolyzable metal compounds not containing silicon may be used in minor amounts. These hydrolyzable compounds may be selected from at least one metal M from main groups III to V, especially III and IV and/or transition groups II to V of the periodic table of the elements, and preferably comprise hydrolyzable compounds of Al, B, Sn, Ti, Zr, V or Zn, especially those of Al, Ti or Zr, or mixtures of two or more of these elements. These compounds normally satisfy the formula $MX_n$ where X is as defined in formula (I), typically alkoxy, and n equals the valence of the metal M (usually 3 or 4). One or more substituents X may be substituted by a chelate ligand. Also, hydrolyzable compounds of metals of main groups I and II of the periodic table (e.g., Na, K, Ca and Mg), from transition groups VI to VII of the periodic table (e.g., Mn, Cr, Fe, and Ni), and of the lanthanides may be used. As noted above, these other hydrolyzable compounds are generally used in low amounts, e.g. in catalytic amounts, if at all. The optional catalytic use is explained below.

Generally, the condensation product of the above-mentioned hydrolyzable silanes is prepared by hydrolysis and condensation of said starting compounds in accordance with the sol-gel method, which is known to those skilled in the art. The sol-gel method generally comprises the hydrolysis of said hydrolyzable silanes, optionally aided by acid or basic catalysis. The hydrolysed species will condense at least partially. The hydrolysis and condensation reactions cause the formation of condensation products having e.g. hydroxy groups and/or oxo bridges. The hydrolysis/condensation product may be controlled by appropriately adjusting parameters, such as e.g. the water content for hydrolysis, temperature, period of time, pH value, solvent type, and solvent amount, in order to obtain the condensation degree and viscosity desired.

Moreover, it is also possible to use a metal alkoxide in order to catalyse the hydrolysis and to control the degree of condensation. For said metal alkoxide, the other hydrolyzable compounds defined above may be used, especially an aluminium alkoxide, a titanium alkoxide, a zirconium alkoxide, and corresponding complex compounds (e.g. with acetyl acetone as the complex ligand) are appropriate.

In the sol-gel process, a solvent may be used. However, it is also possible to conduct the sol-gel process without a solvent. Usual solvents may be used, e.g. alcohols such as aliphatic $C_1$-$C_8$ alcohols, e.g. methanol, ethanol, 1-propanol, isopropanol and n-butanol, ketones, such as $C_{1-6}$ alkylketones, e.g. acetone and methyl isobutyl ketone, ether, such as $C_{1-6}$ dialkylether, e.g. diethylether, or diolmonoether, amides, e.g. dimethylformamide, tetrahydrofuran, dioxane, sulfoxides, sulfones, and glycol, e.g. butylglycol, and mixtures thereof. Alcohols are preferred solvents. The alcohol obtained during the hydrolysis of hydrolyzable silane alkoxides may serve as a solvent.

Further details of the sol-gel process may e.g. be found in C. J. Brinker, G. W. Scherer: "Sol-Gel Science—The Physics and Chemistry of Sol-Gel-Pro-cessing", Academic Press, Boston, San Diego, New York, Sydney (1990).

Instead of the hydrolyzable silane monomers already partially or completely (pre)hydrolyzed species or precondensates of said monomers may be used as starting materials. The condensation product used in the present invention represents an organically modified inorganic polycondensate due to the non-hydrolyzable organic substituents of the silanes used. The condensation degree and viscosity depend from the properties desired and can be controlled by the skilled person. Usually a rather complete condensation degree in respect to silicon will be obtained in the final cured product. Polymerizable groups, if present in the condensation product of the coating composition, are normally essentially unreacted and serve for polymerizing or crosslinking during the following curing step.

The composite coating composition further comprises at least one cationically polymerizable organic resin which is preferably cationically photopolymerizable. The cationically polymerizable resin is preferably a cationically polymerizable epoxy resin known to those skilled in the art. The cationically polymerizable resin can also be any other resin having electron rich nucleophilic groups such as vinylamine, vinylether, vinylaryl or having heteronuclear groups such as aldehydes, ketones, thioketones, diazoalkanes. Of special interest are also resins having cationically polymerizable ring groups such as cyclic ethers, cyclic thioethers, cyclic imines, cyclic esters (lactone), cyclic amide (lactame) or 1,3-dioxacycloalkane (ketale). Further species of cationically polymerizable resins are spiroorthoesters and spiroorthocarbohates such as 1,5,7,11-tetraoxaspiro-[5.5]-undecane.

The term "cationically polymerizable resin" herein refers to an organic compound having at least 2 cationically polymerizable groups including monomers, dimers, oligomers or polymers or mixtures thereof. The melting point of the resin is preferably 40° C. or higher for producing high-resolution patterning. Generally cationic polymerisation is accelerated by thermal treatment. That is, the polymerisation reaction depends on the diffusion of activated species (protons). It is preferred that the cationically polymerizable organic resin is solid at room temperature in order to prevent unnecessary diffusion during the patternwise exposure process and to obtain high-resolution patterning.

Accordingly, the cationically polymerizable organic resin preferably comprises epoxy compounds, such as epoxy monomers, dimers, oligomers, and polymers. The epoxy compound used for the coating composition is preferably solid at room temperature (approx. 20° C.), more preferably it has a melting point of 40° C. or higher for producing high-resolution patterning.

Examples of said epoxy compound for the coating composition are epoxy resins having at least one of the structural units (1) and (2):

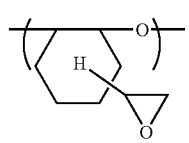

(1)

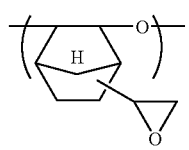

(2)

Further examples are epoxy resins of the bisphenol type (e.g. bisphenol A diglycidylether (Araldit® GY 266 (Ciba)), bisphenol F diglycidylether), epoxy resins of the novolak type, such as phenol novolak (e.g. poly[(phenyl-2,3-epoxypropylether)-ω-formaldehyde]) and cresol novolak, and epoxy resins of the triphenylolmethane type, e.g. triphenylolmethane triglycidylether, as well as cycloaliphatic epoxy resins, e.g. 4-vinylcyclohexenediepoxide, 3,4-epoxycyclohexane carboxylic acid-(3,4-epoxycyclohexylmethylester (UVR 6110, UVR 6128 (Union Carbide)), tetrahydro and hexahydrophtalic acid diglycidylether, and glycidylether of polyols. Additional examples are N,N-bis-(2,3-epoxypropyl)-4-(2,3-epoxypropoxy)aniline and bis-{4-[bis-(2,3-epoxypropyl)-amino]-phenyl}methane.

The mixing ratio by weight of said condensation product and said cationically polymerizable organic resin is preferably 0.001:1-1:1 in the composite coating composition of the invention.

The composite coating composition according to the present invention further contains a cationic initiator. Cationic initiators are commercially available and known in the art. The specific type of the cationic initiator used may e.g. depend on the type of cationically polymerizable groups present, the mode of initiation (thermal or photolytic), the temperature, the type of radiation (in the case of photolytic initiation) etc.

Suitable initiators include all common initiator/initiating systems, including cationic photoinitiators, cationic thermal initiators, and combinations thereof. Cationic photoinitiators are preferred. Representative of cationic initiators that can be used include onium salts, such as sulfonium, iodonium, carbonium, oxonium, silicenium, dioxolenium, aryldiazonium, selenonium, ferrocenium and immonium salts, borate salts, e.g. [$BF_3OH$]H (obtainable from $BF_3$ and traces of water) and corresponding salts of Lewis acids such as $AlCl_3$, $TiCl_4$, $SnCl_4$, compounds containing an imide structure or a triazene structure, Meerwein complexes, e.g. [$(C_2H_5)_3O$]$BF_4$, perchloric acid, azo compounds and peroxides. Suitable cationic thermal initiators are 1-methylimidazole, $(C_6H_5)_3C_+$ [$SbCl_6$]$^-$, $(C_6H_5)_3C^+$[$SbF_6$]$^-$, $(C_6H_5)_3C^+$[$ClO_4$]$^-$, $(C_7H_7)^+$ [$SbCl_6$]$^-$, $(C_7H_7)^+$[$ClO_4$]$^-$, $(C_2H_5)_4N^+$[$SbCl_6$]$^-$, $(C_2H_5)_3O^+$ [$BF_4$]$^-$ and $(C_2H_5)_3S^+$[$BF_4$]$^-$. As cationic photoinitiators aromatic sulfonium salts or aromatic iodonium salts are advantageous in view of sensitivity and stability. Cationic photoinitiators are commercially available, examples being the photoinitiator Degacure® KI 85 (bis[4-(diphenylsulfonio)phenyl]sulfide-bis-hexafluorphosphate), Cyracure® UVI-6974/UVI-6990, Rhodorsil® 2074 (tolylcumyliodonium-tetrakis(penta-fluorophenylborate)), Silicolease UV200 Cata® (diphenyliodonium-tetrakis(penta-fluorophenylborate)) and SP170®(4,4'-bis[di(β-hydroxyethoxy)phenylsulfonio]phenyl-sulfide-bis-hexafluoroantimonate).

The cationic initiators are employed in the usual amounts, preferably from 0.01-10% by weight, especially 0.1-5% by weight, based on the total solids content of the coating composition.

The main components may be combined in any conventional manner and order. The condensation product may also be prepared in situ in the presence of the organic cationically polymerizable resin.

The coating composition may comprise further conventional additives in accordance with the purpose and desired properties. Specific examples are thixotropic agents, further crosslinking agents, solvents, e.g., the above mentioned solvents, organic and inorganic pigments, UV absorbers, lubricants, levelling agents, wetting agents, adhesion promoters, and surfactants.

For preparing a substrate having a highly alkali-resistant coating, the composite coating composition according to the present invention may be applied to any desired substrate. Examples thereof are metal, glass, ceramic, and plastic substrates, but also paper, building materials, such as (natural) stones, and concrete, and textiles. Examples of metal substrates include copper, aluminium, iron, including steel, and zinc as well as metal alloys, such as brass. Examples of plastic substrates are polycarbonate, polyamide, polymethyl methacrylate, polyacrylates, and polyethylene terephthalate. Glass or ceramic substrates may be e.g. mainly based on $SiO_2$, $TiO_2$, $ZrO_2$, $PbO$, $B_2O_3$, $Al_2O_3$, and/or $P_2O_5$. The substrate may be present in any form, such as, e.g., a plate, a sheet or a film. Of course, surface-treated substrates are also suitable, e.g., substrates having sand-blasted, coated or metalized surfaces, e.g. galvanized iron plates. In a particular embodiment, the substrate is coated with at least one base layer.

The coating composition may be applied to the substrate by any conventional means. In this context, all common wet-chemical coating methods may be used. Representatives methods are e.g. spin coating, dip coating, spray coating, web coating, bar coating, brush coating, flow coating, doctor blade coating and roll coating and printing methods, such as pat printing, silk screen printing, flexo printing and pad printing. A further suitable method is direct coating.

Following application, the coating may be dried, if necessary. Then, the coating composition applied to the substrate is cured (hardened). The curing step includes a cationic polymerisation of said cationically polymerizable organic resin and optionally also of said polymerizable groups in the condensation product, if such silanes had been incorporated. The curing step may be conducted by exposure to light or radiation and/or by heating. In the curing step, the condensation degree of the inorganic polycondensate may be enhanced. Further, the cationically polymerizable resin will generally polymerize which may include crosslinking, thereby forming the desired inorganic-organic hybrid material. It is preferred that curing takes place at least partially by irradiation, i.e. by photopolymerization.

The coating of the invention is especially useful, if the coating is to be contacted with alkaline solutions, but it is also effective in combination with neutral and/or acid solutions.

The coating compositions of the present invention are especially suitable for coating surfaces of metals, plastics, modified or unmodified natural substances, ceramic, concrete, clay and/or glass. The metal surfaces also include surfaces of metal compounds. Examples which may be mentioned are the metals copper, silver, gold, platinum, palladium, iron, nickel, chromium, zinc, tin, lead, aluminium and titanium, and alloys containing these metals, for example (stainless) steel, brass and bronze.

The above coating composition can also be applied to surfaces of oxides, carbides, silicides, nitrides, borides, etc. of metals and non-metals, for example surfaces which comprise or consist of metal oxides, carbides such as silicon carbide, tungsten carbide and boron carbide, silicon nitride, silicon dioxide, etc.

Among the surfaces of (modified or unmodified) natural substances mention may be made in particular of those of natural stone (e.g. sandstone, marble, granite), (fired) clay and cellulose materials, while it is of course also possible to coat surfaces of concrete, ceramic, porcelain, gypsum, glass and paper (including synthetic paper) in an advantageous manner using the above coating compositions. The term "glass" here includes all types of glass with a very wide variety of compositions, examples being soda lime glass, potash glass, borosilicate glass, lead glass, barium glass, phosphate glass, optical glass, and historical glass.

Among the plastics which form surfaces which can be coated with the above coating compositions are thermoplastics, thermosets, elastomers and foamed plastics. Specific examples of such plastics include: homo- and copolymers of olefinically unsaturated compounds, for example olefins such as ethylene, propylene, butenes, pentenes, hexenes, octenes and decenes; dienes such as butadiene, chloroprene, isoprene, hexadiene, ethylidene norbornene and dicyclopentadiene; aromatic vinyl compounds, for example styrene and its derivatives (e.g. α-methylstyrene, chlorostyrenes, bromostyrenes, methylstyrenes); halogenated vinyl compounds, for example vinyl chloride, vinyl fluoride, vinylidene chloride, vinylidene fluoride and tetrafluoroethylene; a,β-unsaturated carbonyl compounds, for example acrylic acid, methacrylic acid, crotonic acid, maleic acid and fumaric acid and their derivatives (especially (alkyl) esters, amides, anhydrides, imides, nitriles and salts, for example ethyl acrylate, methyl methacrylate, acrylonitrile, methacrylonitrile, (meth)acrylamide and maleic anhydride); and vinyl acetate.

Further examples are polyesters such as, for example, polyethylene terephthalate and polybutylene terephthalate; polyamides such as nylons; polyimides; polyurethanes; polyethers; polysulphones; polyacetals; epoxy resins; polycarbonates; polyphenylene sulphides; (vulcanized or non-vulcanized) synthetic rubbers; (vulcanized) natural rubber; phenol-formaldehyde resins; phenol-urea resins; phenol-melamine resins; alkyd resins; and polysiloxanes.

Plastics of this kind may of course contain the customary plastics additives, for example fillers, pigments, dyes, reinforcing agents (e.g. (glass) fibres), stabilizers, flame proofing agents, inhibitors, and lubricants.

The above coating compositions are particularly suitable for the coating of constructions and parts thereof; means of locomotion and of transport and parts thereof; operating equipment, devices and machines for commercial and industrial purposes and research, and parts thereof; domestic articles and household equipment and parts thereof; equipment, apparatus and accessories for games, sport and leisure, and parts thereof; and also instruments, accessories and devices for medical purposes and sick persons. Specific examples of such coatable materials and articles are indicated below.

Constructions (especially buildings) and parts thereof include:

Interior and exterior facings of buildings, floors and staircases made of natural stone, concrete, etc., floor coverings of plastic, fitted and loose carpets, base boards (skirting boards), windows (especially window frames, window sills, glazing of glass or plastic and window handles), Venetian blinds, roller blinds, doors, door handles, WC, bath and kitchen fittings, shower cabinets, sanitary modules, lavatories, pipes (and especially drainage pipes where the deposition of dirt is to be avoided), radiators, mirrors, light switches, wall and floor tiles, lighting, letter boxes, roof tiles, guttering, aerials, satellite dishes, handrails of balconies and moving stairways, architectural glazing, solar collectors, winter gardens, walls of lifts; memorials, sculptures and, generally, works of art made of natural stone (e.g. granite, marble), metal, etc., especially those erected outdoors.

Means of locomotion and of transport (e.g. car, lorry, bus, motorbike, moped, bicycle, railway, tram, ship and aircraft) and parts thereof:

Headlamps, interior and exterior mirrors, windscreens, rear windows, side windows, mudguards of bicycles and motorbikes, plastic visors of motorbikes, instruments of motorbikes, seats, saddles, door handles, steering wheels, tyre rims, fuel-tank ports (especially for diesel), number plates, luggage racks, roof containers for cars, and cockpits. For example, the exterior coating of motor vehicles makes them easier to clean (wash).

Operating equipment, devices and machines for commercial and industrial purposes and research, and parts thereof:

Moulds (e.g. casting moulds, especially those made of metal), hoppers, filling units, extruders, water wheels, rollers, conveyor belts, printing presses, screen-printing stencils, dispensing machines, (machine) housings, injection-moulded components, drill bits, turbines, pipes (interior and exterior), pumps, saw blades, screens (for example for scales), keyboards, switches, knobs, ball bearings, shafts, screws, displays, solar cells, solar units, tools, tool handles, containers for liquids, insulators, capillary tubes, lenses, laboratory equipment (e.g. chromatography columns and hoods) and computers (especially casings and monitor screens).

Domestic articles and household equipment and parts thereof:

Furniture veneers, furniture strips, rubbish bins, toilet brushes, table cloths, crockery (for example made of porcelain and stoneware), glassware, cutlery (e.g. knives), trays, frying pans, saucepans, baking sheets, cooking utensils (e.g. cooking spoons, graters, garlic presses, etc.), inset cooking plates, hotplates, ovens (inside and outside), flower vases, covers for wall clocks, TV equipment (especially screens), stereo equipment, housings of (electrical) domestic equipment, picture glass, wallpaper, lamp and lights, upholstered furniture, articles of leather.

In particular the coating of furniture simplifies cleaning and avoids any visible surface marks.

Equipment, apparatus and accessories for games, sport and leisure:

Garden furniture, garden equipment, greenhouses (especially glazed), tools, playground equipment (e.g. slides), balls, airbeds, tennis rackets, table-tennis bats, table-tennis tables, skis, snow boards, surf boards, benches in parks, playgrounds, etc., motor bike clothing, motor bike helmets, ski suits, ski boots, ski goggles, crash helmets for suits and diving goggles.

Instruments, accessories and devices for medical purposes and sick persons:

Prostheses (especially for limbs), implants, catheters, anal prostheses, dental braces, false teeth, spectacles (lenses and frames), medical instruments (for operations and dental treatment), plaster casts, clinical thermometers and wheelchairs, and also, quite generally, hospital equipment, in order to improve (inter alia) hygiene.

In addition to the above articles it is also possible, of course, to coat other articles and parts thereof, advantageously, with the above coating compositions, examples being jewellery, coins, works of art (for example paintings), book covers, gravestones, urns, signs (for example traffic signs), neon signs, traffic light pillars, CDs, wet-weather clothing, textiles, post boxes, telephone booths, shelters for public transport, protective goggles, protective helmets, rockets, the inside of food packaging and oil canisters, films (for example for packaging foods), telephones, seals for water taps, and quite generally all articles produced from rubber, bottles, light-, heat- or pressure-sensitive recording materials (before or after recording, for example photos), and church windows, and also articles (for example made of steel plate) subject to graffiti (for example the exterior and interior of railway carriages, walls of underground and over ground urban railway stations, etc.). It is possible to give photosensitivity to the liquid-repellent layer and it is possible to form optical gratings or other optical structures.

The composite coating composition according to the present invention may be cured by a combination of exposure to radiation or light and heating. Exposure and heating may be conducted simultaneously and/or successively. It may be advantageous to cure first by a combined treatment of irradiation and heating and subsequently complete the curing step by heating alone.

The appropriate irradiation depends e.g. on the type of cationically polymerizable resins and polymerizable groups of the silane, if present, and the cationic initiator used. For example, UV radiation or laser light may be employed. During the step of exposure to light or radiation and/or heating, the cationic initiator may generate an acid. Besides the polymerisation of the cationically polymerizable resin and optionally said polymerizable groups of the condensation product, this acid may also assist in curing the siloxane framework (inorganic condensation) almost to completion, especially when the coating is heated.

After curing, a low surface free energy coating with extremely high alkali resistance and excellent mechanical properties is obtained which also shows surprisingly good photo-patterning properties.

Thus, the composite coating composition can advantageously be used for pattern forming methods where the coating forms a pattern. In these methods, the composition is applied to a substrate in the usual manner as mentioned above. The applied coating may then be cured patternwise and subsequently developed to dissolve uncured material, thereby forming a pattern. Usually the patternwise curing is effected by irradiation. For example, photocuring may be effected by a photolitho-graphic method or a two wave mixing method.

By using the composite coating composition of the present invention in such a pattern forming method, it is possible to obtain a pattern which includes portions having an aspect ratio $H/W \geqq 1$ (H: pattern height, W: pattern width), preferably an aspect ratio $H/W \geqq 3$. It is also possible to form patterns which comprise portions having a pattern width of 100 micrometer or less.

The following examples illustrate the invention without restricting it.

Synthesis Example 1

A hydrolytic condensation product was compounded according to the following procedures. 28 g of glycidyloxypropyltriethoxysilane (0.1 moles), 18 g of methyltriethoxysilane (0.1 moles), 7.6 g of tridecafluoro-1,1,2,2-tetrahydroctyltriethoxysilane (0.015 moles: equivalent to 7 mole % based on the total hydrolyzable silanes), 17.3 g of water and 37 g of ethanol were stirred at room temperature, followed by heating at reflux conditions for 24 hours, after which the hydrolytic condensation product was obtained. The condensation product was diluted by 2-butanol/ethanol to a solid content of 20 wt.-%.

Synthesis Example 2

A hydrolyzable condensation product was obtained in the same way as in Synthesis Example 1, except that 4.4 g of a mixture of tridecafluoro-1,1,2,2-tetrahydrooctyltriethoxysilane, and heptadecafluoro-1,1,1,2-tetrahydrodecyltriethoxysilane, was used instead of 7.6 g of tridecafluoro-1,1,2,2-tetrahydroctyltriethoxysilane. The condensation product obtained was also diluted with 2-butanol/ethanol to a solid content of 20 wt.-%.

Example 3

Coatings and Evaluation

Each condensation product of Example 1 and 2 were mixed according to the following ratio to obtain Compositions 1 and 2.

|  | Composition 1 (parts) | Composition 2 (parts) |
|---|---|---|
| Product of Synthesis Example 1 (20 wt. - % solution) | 25 | — |
| Product of Synthesis Example 2 (20 wt. - % solution) | — | 25 |
| Epoxy resin EHPE-3150* (Daisel Chemical) | 100 | 100 |
| Photocationic initiator SP172 (Asahi Denka Ind.) | 5 | 5 |
| Solvent MIBK/isopropyl cellosolve = 1/1 (by wt.) | 70 | 70 |

*EHPE is an epoxy resin having structural units (1) mentioned above. Its melting point is 70° C.

The coating compositions 1 and 2 were each applied to a silicon wafer by a spin coating method. The applied coatings were dried at 90° C. for 3 minutes. The thickness of coatings was about 18 μm. Then the coatings were exposed to UV radiation (mask aligner "MPA600 super" made by CANON) and heated to 90° C. for 4 minutes. Next, the coatings were developed (washed out) by a mixed solution methyl isobutyl ketone (MIBK)/xylene (ratio 2/3) to remove non-exposed portions. It can be seen that the exposed portions were cured, the non-exposed portions were washed out and that the cured (remaining) portions have a high liquid repellency.

Thereafter, the contact angles were measured to evaluate the level of liquid repellancy to water. An automatic contact angle meter (Krüss G2) was used. Henceforth, $\Theta_a$ means an advancing contact angle and $\Theta_r$ means a receding contact angle. The results are shown in Table 1:

TABLE 1

|  | $\Theta_a$ | $\Theta_r$ |
|---|---|---|
| Composition 1 | 108 | 90 |
| Composition 2 | 115 | 95 |

Subsequently, the alkaline resistance of the liquid-repellent layers was examined by immersing said coatings having liquid-repellent layers into an alkaline solution (NaOH aqueous solution pH=10) for one month at a temperature of 60° C. The results are shown in Table 2:

TABLE 2

|  | initial | | after immersion | |
|---|---|---|---|---|
|  | $\Theta_a$ | $\Theta_r$ | $\Theta_a$ | $\Theta_r$ |
| Composition 1 | 108 | 90 | 92 | 75 |
| Composition 2 | 115 | 95 | 100 | 84 |

Figure 2:
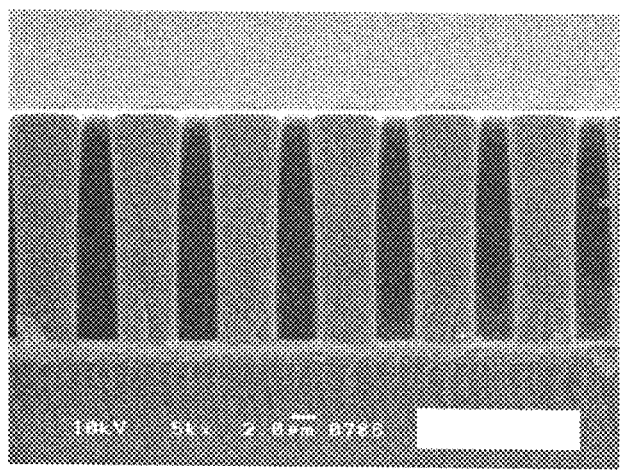
FIG. 2 shows a high resolution and high aspect ratio second pattern obtainable with a coating composition of the present invention.
Figure 3:
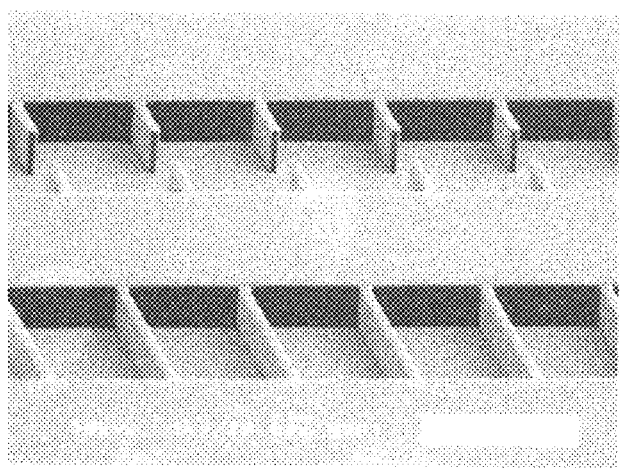
FIG. 3 shows a high resolution and high aspect ratio third pattern obtainable with a coating composition of the present invention.

After the immersion test, any peeling of the liquid-repellent layer from the silicon wafer was not observed. The high resolution and high aspect ratio pattern obtainable with Composition 1 are shown in FIGS. 1 to 3. The surfaces of these patterns show a high liquid repellency.

Desirable patterns were obtained by a pattern mask design under photo-patterning conditions with high aspect ratios, if necessary. In the structure of FIG. 2 contact angles against water of more than 130° are obtained.

The liquid-repellent layers of this invention showed a very high contact angle against water, i.e., a high liquid repellency. A sufficient liquid repellency is also maintained after the immersing test showing the long-term preservation even in alkaline solution. Also an excellent adhesion on substrates is maintained after the immersing test showing a long-term preservation even in alkaline solution. A further enhanced liquid repellency is obtained when the hydrolyzable condensation product comprises two or more hydrolyzable silane compounds having fluorinated alkyl groups of different length. The liquid-repellent composition of this invention showed excellent patterning capability by photolithography.

What is claimed is:

1. A cationically polymerizable composite coating composition, comprising:
   a) a condensation product of:
      1) a hydrolyzable silane according to general formula (IV):

$$CF_3(CF_2)_n—Z—SiX_3 \quad (IV),$$

wherein X is a hydrolyzable substituent, Z is a divalent alkylene or alkyleneoxy group, and n is an integer from 0 to 20,
      2) a hydrolyzable silane not containing a fluorine atom according to general formula (II):

$$R_aSiX_{(4-a)} \quad (II),$$

wherein R is a non-hydrolyzable substituent having an alkyl or aryl group, X is a hydrolyzable substituent, and a is an integer from 0 to 3, and
      3) a hydrolyzable silane according to general formula (III):

$$RcSi(R)_bX_{(3-b)} \quad (III),$$

wherein Rc is a non-hydrolyzable substituent having a polymerizable group, R is a non-hydrolyzable substituent, X is a hydrolyzable substituent; and b is an integer from 0 to 2;
   b) at least one cationically polymerizable organic resin having a melting point of 40° C. or higher, and
   c) a cationic initiator.

2. The cationically polymerizable composite coating composition of claim 1 wherein the composite coating composition is cationically photopolymerizable.

3. The cationically polymerizable composite coating composition according to claim 1 wherein said at least one cationically polymerizable resin comprises a cationically photopolymerizable resin.

4. The cationically polymerizable composite coating composition according to claim 1 wherein said at least one cationically polymerizable resin comprises an epoxy compound.

5. The cationically polymerizable composite coating composition of claim 4 wherein said epoxy compound is solid at room temperature.

6. The cationically polymerizable composite coating composition according to claim 1 wherein said at least one cationically polymerizable resin comprises at least one of the structural units (1) and (2):

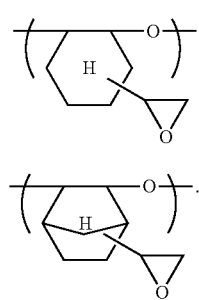

7. The cationically photopolymerizable composite coating composition according to claim 1 wherein said at least one cationically polymerizable resin is selected from an epoxy resin of the bisphenol type, an epoxy resin of the novolak type and an epoxy resin of the triphenylolmethane type.

8. The cationically polymerizable composite coating composition according to claim 1 wherein the mixing ratio by weight of (A) said condensation product and (B) said at least one cationically polymerizable organic resin ((A):(B)) is from 0.001:1-1:1.

9. The cationically polymerizable composite coating composition of claim 1, wherein X is methoxy or ethoxy.

10. The cationically polymerizable composite coating composition of claim 1, wherein n is from 10 to 20 and Z a divalent alkylene or alkyleneoxy group having 3 to 6 carbon atoms.

11. A substrate having an alkali-resistant coating, said coating comprising a cured composite coating composition according to claim 1.

12. The substrate having an alkali-resistant coating of claim 11 wherein said substrate is selected from a metal, glass, ceramic or plastic substrate, said substrates being optionally pre-treated or pre-coated.

13. The substrate having an alkali-resistant coating of claim 11 wherein the coating is patterned.

14. The substrate having an alkali-resistant coating of claim 13 wherein the pattern comprises portions with an aspect ratio H/W of at least 1 wherein H is the pattern height and W is the pattern width.

15. The substrate having an alkali-resistant coating of claim 13 wherein the pattern comprises portions with an aspect ratio H/W of at least 3 wherein H is the pattern height and W is the pattern width.

16. The substrate having an alkali-resistant coating of claim 13 wherein the pattern comprises portions with a pattern width of 100 micrometer or less.

17. A process of preparing a substrate having an alkali-resistant coating comprising:
   a) applying a cationically polymerizable composite coating composition according to claim 1 to a substrate,
   b) optionally drying said applied composite coating composition, and
   c) curing said applied composite coating composition.

18. The process of claim 17 wherein said curing includes cationic polymerisation.

19. The process of claim 17 wherein said composite coating composition is applied by a method selected from direct coating, spin coating, dip coating, spray coating, web coating, bar coating, brush coating, doctor blade coating and roll coating.

20. The process of claim 17 wherein said composite coating composition is applied by a printing method.

21. The process of claim 20 wherein said composite coating composition is applied by a printing method selected from pat printing, flex printing, silk screen printing and pad printing.

22. The process according to claim 17 wherein said composite coating composition is cured patternwise and developed to obtain a coating comprising a pattern.

23. The process of claim 22 wherein said patternwise curing is conducted employing a photolithographic method or a two wave mixing method.

* * * * *